(12) United States Patent
Hashinaga

(10) Patent No.: US 11,152,900 B2
(45) Date of Patent: Oct. 19, 2021

(54) MULTISTAGE AMPLIFIER

(71) Applicant: SUMITOMO ELECTRIC INDUSTRIES, LTD., Osaka (JP)

(72) Inventor: Tatsuya Hashinaga, Osaka (JP)

(73) Assignee: SUMITOMO ELECTRIC INDUSTRIES, LTD., Osaka (JP)

( * ) Notice: Subject to any disclaimer, the term of this patent is extended or adjusted under 35 U.S.C. 154(b) by 27 days.

(21) Appl. No.: 16/708,676

(22) Filed: Dec. 10, 2019

(65) Prior Publication Data
US 2020/0186108 A1    Jun. 11, 2020

(30) Foreign Application Priority Data

Dec. 11, 2018   (JP) .............................. JP2018-231804

(51) Int. Cl.
H03F 1/32      (2006.01)
H03F 3/21      (2006.01)
H03F 3/193     (2006.01)

(52) U.S. Cl.
CPC ........... *H03F 3/211* (2013.01); *H03F 1/3205* (2013.01); *H03F 3/1935* (2013.01)

(58) Field of Classification Search
CPC ........... H03F 1/32; H03F 1/3223; H03F 3/191
USPC ......... 330/150, 151; 455/114.1, 114.2, 114.3
See application file for complete search history.

(56) References Cited

U.S. PATENT DOCUMENTS

| 6,392,491 | B1 | 5/2002 | Ohkawa et al. |
| 2009/0015326 | A1 | 1/2009 | Ito et al. |
| 2015/0031317 | A1* | 1/2015 | Wang ................... H04B 1/0475 455/114.3 |

FOREIGN PATENT DOCUMENTS

| JP | H1-302901 | 12/1989 |
| JP | 2000-252765 | 9/2000 |
| JP | 2008-048032 | 2/2008 |
| JP | 2008-271289 | 11/2008 |

* cited by examiner

*Primary Examiner* — Steven J Mottola
(74) *Attorney, Agent, or Firm* — Smith, Gambrell & Russell, LLP.

(57) ABSTRACT

A multistage amplifier includes: N amplifiers (N≥2), a $(k+1)^{th}$ amplifier cascaded to a $k^{th}$ amplifier (1≤k≤N−1), and each amplifier being configured to amplify a multicarrier signal; and an extraction circuit including an input and an output, the input being connected to an output of a $j^{th}$ amplifier (1≤j≤N−1), and the output providing a compensation signal to an input of a $(j+1)^{th}$ amplifier or an output of the $(j+1)^{th}$ amplifier. The extraction circuit includes a filter circuit connected to the output of the $j^{th}$ amplifier that extracts a distortion frequency component of n times a differential frequency f2−f1 (n≥1), a phase shifter cascaded to the filter circuit that shifts a phase of the component, and a gain adjustment circuit cascaded to the phase shifter that adjusts an amplitude of the component and generates the compensation signal.

11 Claims, 16 Drawing Sheets

MULTISTAGE AMPLIFIER

TECHNICAL FIELD

The present disclosure relates to a multistage amplifier that amplifies a signal including a carrier frequency.

BACKGROUND

In the related art, in a facility such as a base station that constitutes a portable telephone system, an amplifier that amplifies a multicarrier signal including a plurality of carrier frequencies is used, and the amplifier is provided with a unit that compensate a distortion that occurs in the amplifier. For example, Japanese Unexamined Patent Publication No. H01-302901 discloses a configuration in which a distortion component of an output of the amplifier is minimized. In addition, Japanese Unexamined Patent Publication No. 2000-252765 discloses a configuration in which a passive filter circuit configured to reduce a noise level that occurs as a modulation product with the multicarrier signal is added to an output side of the amplifier. In addition, Japanese Unexamined Patent Publication No. 2008-48032 discloses a configuration in which a plurality of signal generation circuits which output distortion compensation signals of different orders are provided on the input side of the amplifier. Similarly, Japanese Unexamined Patent Publication No. 2008-271289 discloses a configuration in which a plurality of signal generation circuits which output different distortion compensation signals are provided on the input side of the amplifier, and the signal generation circuits generate odd-order distortion.

In the configuration of the amplifier of the related art, it is difficult to sufficiently reduce second-order intermodulation distortion or cross modulation due to harmonics of the second-order intermodulation distortion, and quality of an output signal tends to deteriorate. Particularly, in a case where a band of the multicarrier signal is wide, relatively low-order harmonic distortion enters the band, and thus the quality of the output signal may deteriorate. Accordingly, it is desired to improve the quality of the output signal by sufficiently reducing the second-order intermodulation distortion or the cross modulation due to harmonics of the distortion.

SUMMARY

According to an aspect of the present disclosure, there is provided a multistage amplifier for amplifying a multicarrier signal including a first component having a first frequency f1 and a second component having a second frequency f2. The multistage amplifier includes: N amplifiers (N is an integer equal to or greater than 2), each amplifier being distinguished as an $i^{th}$ stage of amplifier (i is an integer of 1 to N), a $(k+1)^{th}$ stage of amplifier being cascaded to a $k^{th}$ stage of amplifier ($1 \leq k \leq N-1$), and each amplifier being configured to amplify the multicarrier signal; and a compensation circuit including an input and an output, the input being connected to an output of a $j^{th}$ stage of amplifier (j is an integer of 1 to N−1), and the output providing a compensation signal to an input of a $(j+1)^{th}$ stage of amplifier or an output of the $(j+1)^{th}$ stage of amplifier. The compensation circuit includes a filter circuit being connected to the output of the $j^{th}$ stage of amplifier and being configured to extract a distortion frequency component that is n times a differential frequency f2−f1 (n is an integer equal to or greater than 1), a phase shifter circuit being cascaded to the filter circuit, and being configured to shift a phase of the distortion frequency component, and an amplitude adjusting circuit being cascaded to the phase shifter circuit and being configured to adjust an amplitude of the distortion frequency component and generate the compensation signal.

DETAILED DESCRIPTION

Figure 1:
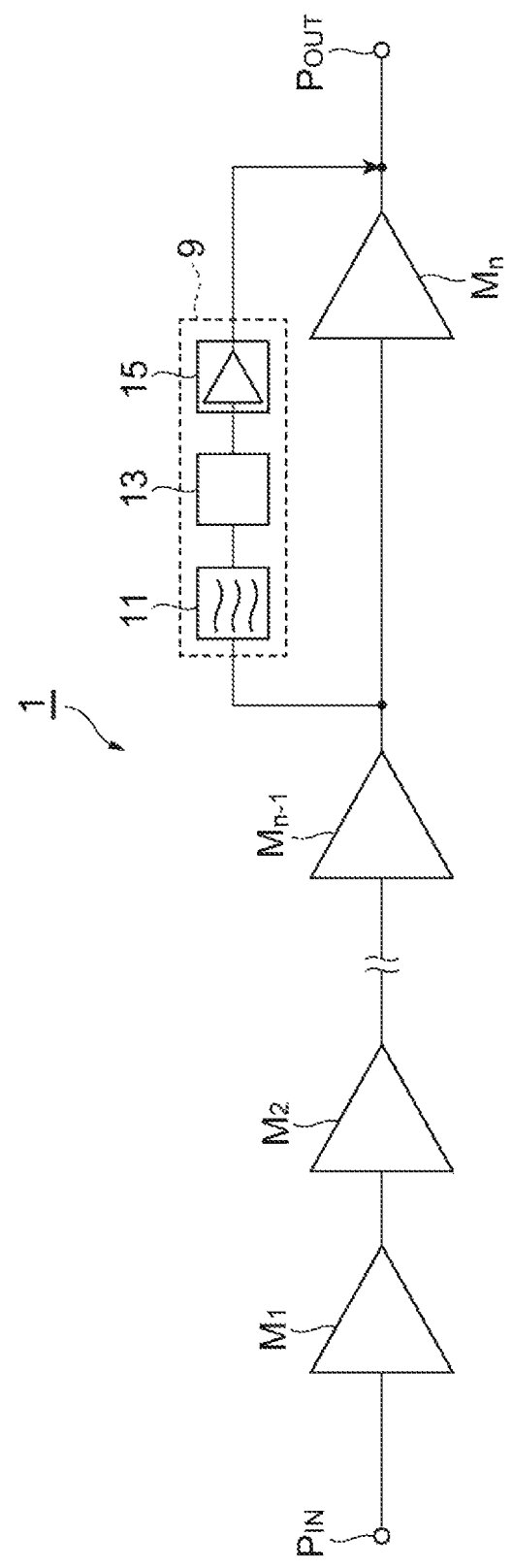
FIG. 1 is a block diagram illustrating a schematic configuration of a multistage amplifier 1 according to an embodiment.

Hereinafter, an embodiment of the present disclosure will be described with reference to the accompanying drawings. Note that, in description of the drawings, the same reference numeral will be given to the same element, and redundant description thereof will be omitted.

[Configuration of Multistage Amplifier]

FIG. 1 is a block diagram illustrating a configuration of a multistage amplifier 1 according to the embodiment. The multistage amplifier 1 is used for amplifying an analog signal (a multicarrier signal) including a plurality of carrier frequencies in a facility such as a base station that constitutes a portable telephone system. For example, a multicarrier signal that is input to the multistage amplifier 1 is a signal including at least a signal of a first carrier frequency $f_1$ and a signal of a second carrier frequency $f_2$. The first carrier frequency $f_1$ and second carrier frequency $f_2$ are not particularly limited to a specific value, and are frequencies in a band of 2 GHz (for example, $f_1$ is 1810 MHz and $f_2$ is 2160 MHz).

As illustrated in FIG. 1, the multistage amplifier 1 includes an input terminal $P_{IN}$ to which a multicarrier signal is input, an output terminal $P_{OUT}$ from which an amplified multicarrier signal is output, and a first to $n^{th}$ stages of amplifiers $M_1, M_2, \ldots, M_{n-1}$, and $M_n$ (n is a natural number equal to or greater than 2) which are cascaded between the input terminal $P_{IN}$ and the output terminal $P_{OUT}$. The amplifier $M_1$ amplifies the multicarrier signal input from the input terminal $P_{IN}$ and outputs the amplified multicarrier signal to the subsequent stage of amplifier $M_2$. Each of the amplifiers $M_2, \ldots,$ and $M_{n-1}$ amplifies the multicarrier signal input from each of the previous stages of amplifiers $M_1, \ldots,$ and $M_{n-2}$, and outputs the resultant amplified multicarrier signal to each of the subsequent stages of amplifiers $M_3, \ldots,$ and $M_n$. The final stage of amplifier $M_n$ amplifies the multicarrier signal input from the previous stage of amplifier $M_{n-1}$, and outputs the resultant amplified multicarrier signal to the outside through the output terminal $P_{OUT}$. Due to the multistage configuration, the multistage amplifier 1 can amplify the multicarrier signal in a high amplification rate.

Figure 2:
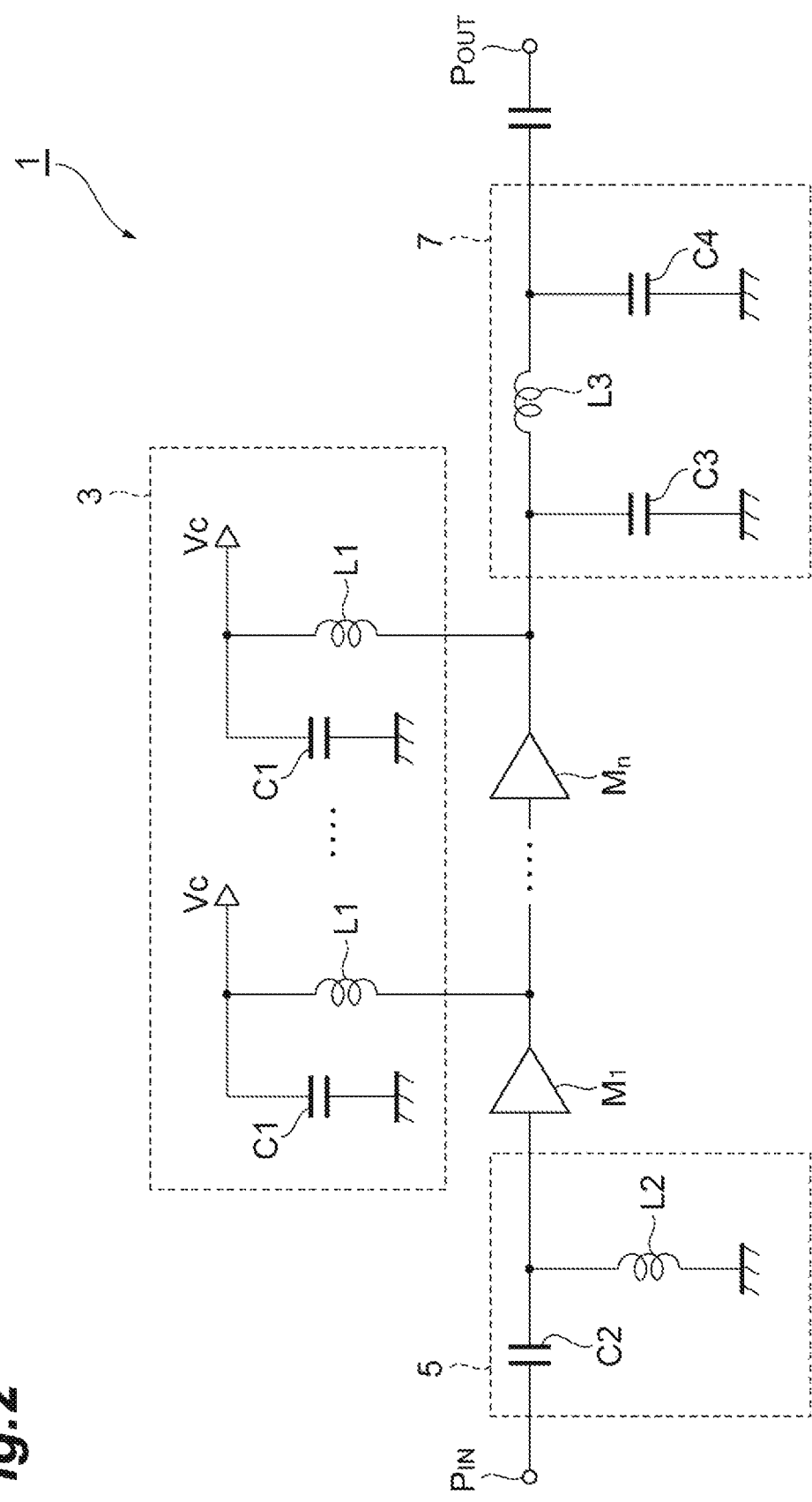
FIG. 2 is a circuit diagram illustrating a connection configuration between stages and a connection configuration on an input side and on an output side of amplifiers $M_1$ to $M_n$ in the multistage amplifier 1 illustrated in FIG. 1.

FIG. 2 illustrates a connection configuration between stages of amplifiers $M_1$, to $M_n$ and a connection configuration on an input side and on an output side in the multistage amplifier 1. Bias circuits including an inductor L1 and a capacitor C1 are respectively connected to outputs of the amplifiers $M_1$ to $M_n$. M pieces of the bias circuits constitute a DC bias supply circuit 3. In the bias circuits, a bias voltage $V_C$ is applied to one end of the inductor L1 and one end of the capacitor C1. In the bias circuits, the other end of the inductor L1 is connected to an output of each of the amplifiers $M_1$ to $M_n$, and the other end of the capacitor C1 is grounded. The DC bias supply circuit 3 supplies a DC bias to the amplifiers $M_1$ to $M_n$. An input matching circuit 5 including a capacitor C2 and an inductor L2 is connected to between the input terminal $P_{IN}$ and an input of the first stage of amplifier $M_1$. An output matching circuit 7 including capacitors C3 and C4, and an inductor L3 is connected to between the final stage of amplifier $M_n$ and the output terminal $P_{OUT}$. In the input matching circuit 5, the input terminal $P_{IN}$ is connected to one end of the capacitor C2, and the other end of the capacitor C2 and one end of the inductor L2 are connected to the input of the first stage of amplifier $M_1$, and the other end of the inductor L2 is grounded. In the output matching circuit 7, one end of the capacitor C3 and one end of the inductor L3 are connected to an output of the final stage of amplifier $M_n$, and the other end of the inductor L3 and one end of the capacitor C4 are connected to the output terminal $P_{OUT}$, and the other ends of the capacitors C3 and C4 are grounded.

Returning to FIG. 1, the multistage amplifier 1 further includes an extraction circuit 9 that is inserted between an output of an $(n-1)^{th}$ stage of amplifier $M_{n-1}$ and an output of the final stage of amplifier $M_n$. The extraction circuit 9 includes a filter circuit 11, a phase shifter 13, and a gain adjustment circuit 15. The filter circuit 11, the phase shifter 13, and the gain adjustment circuit 15 are cascaded in this order. An input of the filter circuit 11 is connected to a transmission path between the output of the $(n-1)^{th}$ stage of amplifier $M_{n-1}$ and the final stage of amplifier $M_n$. The filter circuit 11 filters out a fundamental wave component of the first carrier frequency $f_1$ and the second carrier frequency $f_2$ from the multicarrier signal output from the $(n-1)^{th}$ stage of amplifier $M_{n-1}$ to extract a frequency component (distortion frequency component) of a differential frequency $(f_2-f_1)$ corresponding to a difference of the first carrier frequency $f_1$ and the second carrier frequency $f_2$. For example, the filter circuit 11 is a loss-pass filter that extracts a frequency component of the differential frequency $(f_2-f_1)$. The phase shifter 13 adjusts a phase of a signal of a frequency component of the differential frequency $(f_2-f_1)$ which is output from the filter circuit 11. The gain adjustment circuit 15 is constituted by a variable gain amplifier or a variable attenuator. An input of the gain adjustment circuit 15 is connected to an output of the phase shifter 13, and an output thereof is connected to the output of the final stage of amplifier $M_n$. A signal output from the gain adjustment circuit 15 is multiplexed with a signal output from the final stage of amplifier $M_n$. The gain adjustment circuit 15 adjusts an amplitude (intensity) of the signal of the frequency component of the differential frequency $(f_2-f_1)$ output from the phase shifter 13, and outputs the signal after adjustment.

The extraction circuit 9 having the above-described configuration adjusts the phase and the amplitude of the frequency component of the differential frequency $(f_2-f_1)$ which is extracted from the multicarrier signal output from the amplifier $M_{n-1}$ to reduce the component of the differential frequency $(f_2-f_1)$ in the multicarrier signal output from the final stage of amplifier $M_n$. That is, in the extraction circuit 9, the phase shifter 13 performs the phase adjustment, the gain adjustment circuit 15 performs the amplitude adjustment, and a signal for minimizing the frequency component of the differential frequency $(f_2-f_1)$ which is included in the multicarrier signal output from the amplifier $M_n$ is generated. According to the configuration, it is possible to suppress not only cross modulation due to the frequency component of the differential frequency $(f_2-f_1)$ in an output of the multistage amplifier 1, cross modulation due to harmonics of the component, and cross modulation due to intermodulation distortion caused by the cross modulation.

Here, description will be given of cross modulation that occurs in a case where the multicarrier signal including a signal of the first carrier frequency $f_1$ and a signal of the second carrier frequency $f_2$ is amplified by a multistage amplifier that is not provided with a distortion compensation circuit as a comparative example. Then, an operation and an effect of the multistage amplifier 1 of this embodiment will be described.

Figure 3:
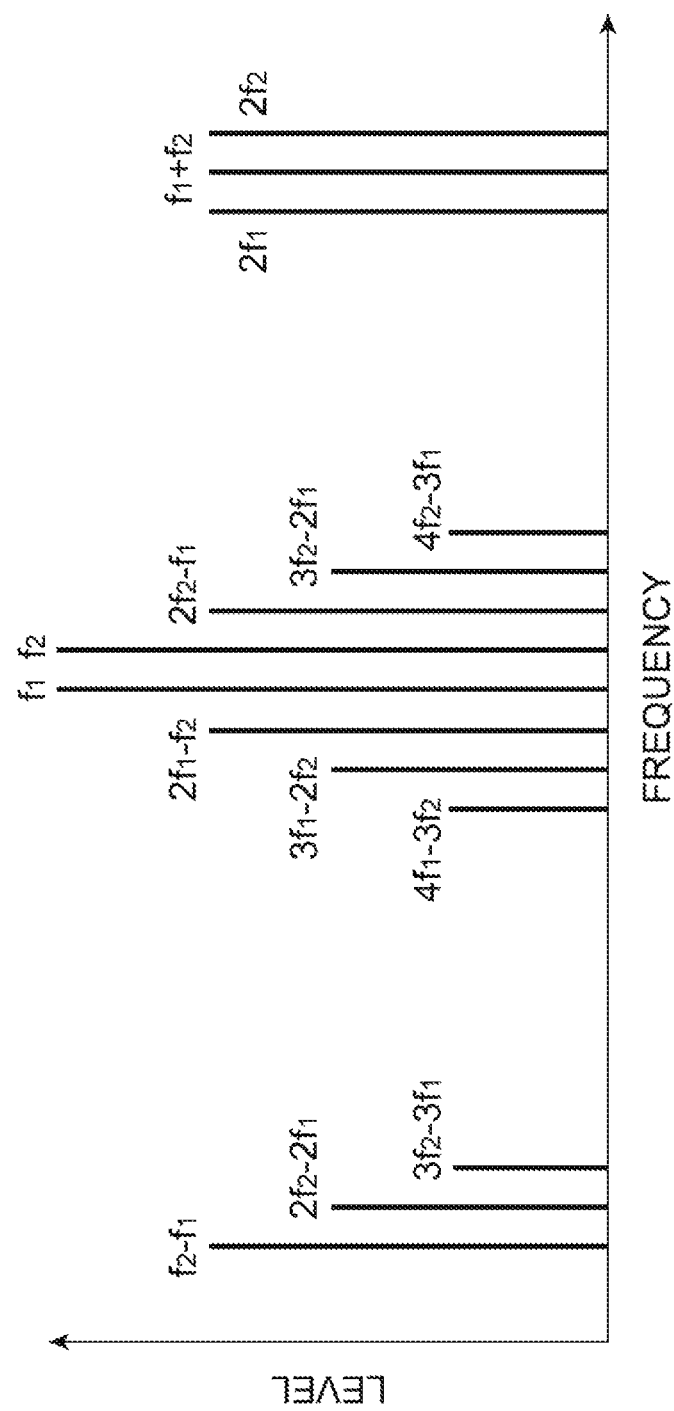
FIG. 3 is a graph showing a frequency spectrum of a multicarrier signal amplified by the multistage amplifier without using a distortion compensation unit.
Figure 4:
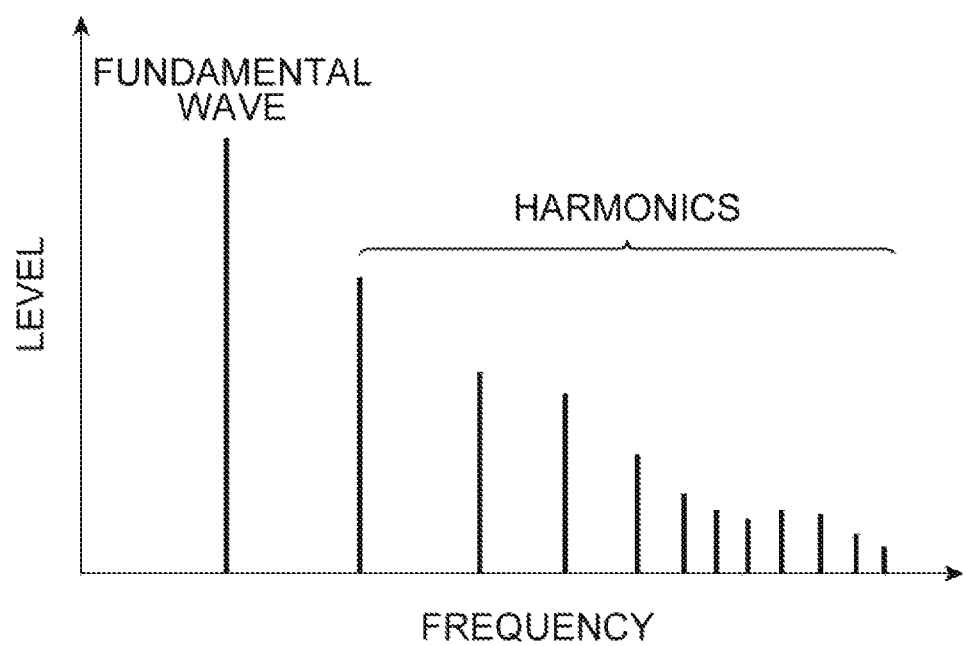
FIG. 4 is a graph showing a frequency spectrum of a multicarrier signal amplified by the multistage amplifier without using the distortion compensation unit.

FIG. 3 and FIG. 4 show an example of a frequency spectrum of the multicarrier signal amplified by the multistage amplifier that is not provided with the distortion compensation circuit. As shown in FIG. 3, when the multicarrier signal is input to the multistage amplifier, signal components of frequencies $\pm k_1 \cdot f_1 \pm k_2 \cdot f_2$ ($k_1$ and $k_2$ are natural numbers) which are generated by intermodulation also appear in an output of the multistage amplifier in addition to the frequencies $f_1$ and $f_2$. The frequency components other than the frequencies $f_1$ and $f_2$ are caused because a gain of the multistage amplifier is nonlinear, and an output signal is distorted with respect to the input signal. $k_1+k_2$ is the order of intermodulation (IM). In addition, as shown in FIG. 4, not only intermodulation distortion shown in FIG. 3 but also harmonic distortion having a frequency component that is an integral multiple of a fundamental wave or intermodulation distortion of the frequencies $f_1$ and $f_2$ is generated at the output of the multistage amplifier.

Figure 5:
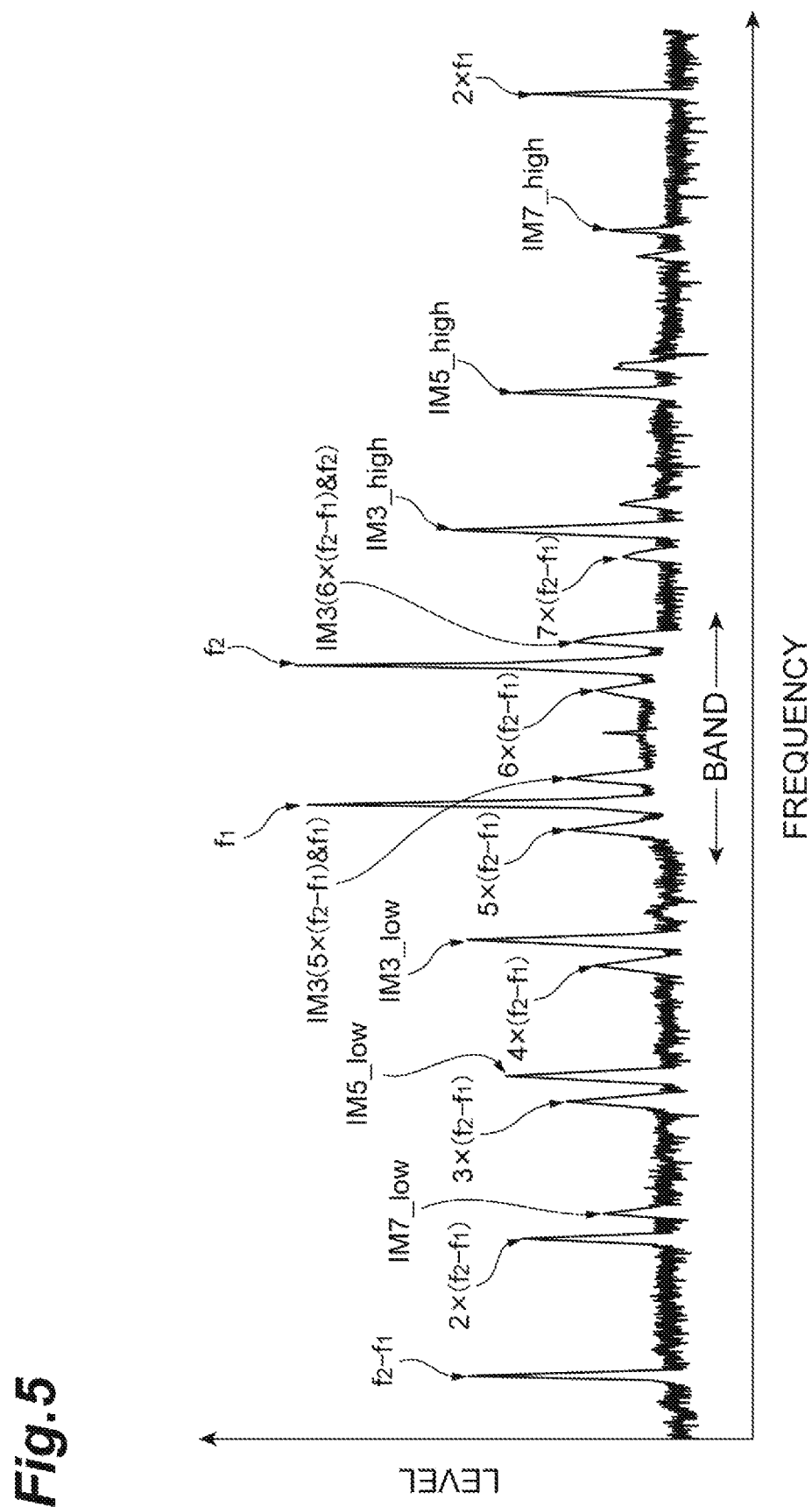
FIG. 5 is a view illustrating an actual waveform of the frequency spectrum of the multicarrier signal amplified by the multistage amplifier that is not provided with the distortion compensation unit.

FIG. 5 illustrates an example of an actual wave of a frequency spectrum of the multicarrier signal amplified by the multistage amplifier that is not provided with the distortion compensation circuit. Here, an example of a case where a multicarrier signal including components of a first carrier frequency $f_1$ of 1810 MHz and second carrier frequency $f_2$ of 2160 MHz are input is illustrated. It can be seen that the following frequency components are included in an output signal of the multistage amplifier.

Frequency components of a fundamental wave: $f_1$ and $f_2$

Frequency component IM3_low of third-order intermodulation distortion: $2f_1-f_2$ Frequency component IM3_high of third-order intermodulation distortion: $2f_2-f_1$ Frequency component IM5_low of fifth-order intermodulation distortion: $3f_1-2f_2$ Frequency component IM5_high of fifth-order intermodulation distortion: $3f_2-2f_1$ Frequency component IM7_low of seventh-order intermodulation distortion: $4f_1-3f_2$ Frequency component IM7_high of seventh-order intermodulation distortion: $4f_2-3f_1$ Frequency component IM2 of second-order intermodulation distortion: $f_2-f_1$ Frequency component of second-order harmonic of the frequency component IM2, second-order intermodulation distortion, and the other intermodulation distortion: $2\times(f_2-f_1)$ Frequency component of third-order harmonic of the frequency component IM2, second-order intermodulation distortion, and the other intermodulation distortion: $3\times(f_2-f_1)$ Frequency component of fourth-order harmonic of the frequency component IM2, second-order intermodulation distortion, and the other intermodulation distortion: $4\times(f_2-f_1)$ Frequency component of fifth-order harmonic of the frequency component IM2, second-order intermodulation distortion, and the other intermodulation distortion: $5\times(f_2-f_1)$ Frequency component of sixth-order harmonic of the frequency component IM2, second-order intermodulation distortion, and the other intermodulation distortion: $6\times(f_2-f_1)$ Frequency component of seventh-order harmonic of the frequency component IM2, second-order intermodulation distortion, and the other intermodulation distortion: $7\times(f_2-f_1)$ Frequency component of second-order harmonic of the fundamental wave: $2\times f_1$, $2\times f_2$ A significant region of the multicarrier signal is a band in a width of 640 MHz centering around 2 GHz. In the output signal as illustrated in FIG. 5, as distortion having an influence on quality of the multicarrier signal, the following distortion components (A1) to (A4) become problematic.

(A1) Frequency component of fifth-order harmonic of the frequency component IM2, second-order intermodulation distortion, and the other intermodulation distortion: $5\times(f_2-f_1)$ (A2) Frequency component of sixth-order harmonic of the frequency component IM2, second-order intermodulation distortion, and the other intermodulation distortion: $6\times(f_2-f_1)$ (A3) Frequency component of third-order intermodulation distortion between the frequency component $f_1$ and the frequency component $5\times(f_2-f_1)$: IM3($5\times(f_2-f_1)\&f_1$)

(A4) Frequency component of third-order intermodulation distortion between the frequency component $f_2$ and the frequency component $6\times(f_2-f_1)$: IM3($6\times(f_2-f_1)\&f_2$)

As described above, in a case where a multicarrier signal including two carrier frequencies is amplified, a frequency of the frequency component IM2 of the second-order intermodulation distortion becomes high, and a harmonic component of a relatively low order enters a signal band. In addition, a harmonic component that is an integral multiple of the frequency component IM2 causes a third-order intermodulation distortion to occur between the harmonic component and the fundamental wave, and the distortion enters the signal band. As a result, the quality of the multicarrier signal deteriorates, and a problem in which the standard of the multicarrier signal is not satisfied may occur.

To compensate the distortion component, it is considered to use a digital distortion compensation system (digital pre-distortion: DPD) in the related art. However, when a frequency band capable of being compensated by the system does not cover a frequency of distortion, distortion compensation becomes difficult, and distortion compensation of the multicarrier signal becomes difficult. For example, in a case of (A1), a band of 10 GHz that is five times 2 GHz is necessary to receive the frequencies $5f_1$ and $5f_2$ which become a generation source of the intermodulation distortion. In addition, even in a case of compensating a fifth-order harmonic of the frequency component IM2, it is necessary to receive a frequency $f_2-f_1=2160$ MHz$-1810$ MHz$=350$ MHz as a generation source. Even in this case, a band of 2000 to 350 MHz close to 2 GHz is necessary, and thus realization as a band of the DPD of the communication system such as a base station is difficult. As the DPD, it is necessary to perform processing up to a frequency component that is smaller than 2 GHz (a central frequency of two carriers) by 350 MHz. That is, it is necessary to apply distortion with respect to an input signal to an FET that constitutes an amplifier, and thus an operation in a band wider than the above-described significant region is necessary to perform the distortion compensation.

On the other hand, according to the multistage amplifier 1 of this embodiment, the frequency component IM2 of the differential frequency $(f_2-f_1)$ corresponding to a difference between the first carrier frequency $f_1$ and the second carrier frequency $f_2$ is extracted from an output signal of the $(n-1)^{th}$ stage of amplifier $M_{n-1}$ by the extraction circuit 9, and the frequency component (compensation component) is multiplexed with the output signal of the final stage of amplifier $M_n$ after adjustment of the phase and the intensity. According to this, in the output of the final stage, it is possible to sufficiently reduce second-order intermodulation distortion based on two fundamental wave components or cross modulation due to harmonics of the second-order intermodulation distortion. According to this, it is possible to improve quality of an output signal. Specifically, it is possible to reduce the frequency component IM2 of the second-order intermodulation distortion, and as a result, it is also possible to reduce harmonics and intermodulation distortion based on the frequency component IM2. Accordingly, it is possible to reduce the above-described distortion components (A1) to (A4) in the output signal. Particularly, in the multistage amplifier 1, the phase shifter 13 and the gain adjustment circuit 15 adjust the phase and the amplitude to compensate the frequency component IM2 included in the output signal. Accordingly, it is possible to reliably reduce the second-order intermodulation distortion or the cross modulation due to the harmonics, and it is possible to sufficiently improve quality in the output signal.

As a configuration for compensating distortion, as described in Japanese Unexamined Patent Publication No. 2000-252765, a configuration using a passive filter circuit is also considered. In the configuration, it is necessary to add a filter circuit to an outer side of a device that constitutes an amplifier, and a parasitic resistance component occurs. Accordingly, when attenuating a component of second-order intermodulation distortion, a component of a fundamental wave (component of a carrier frequency) may also be attenuated. In this embodiment, the output signal of the $(n-1)^{th}$ stage of amplifier $M_{n-1}$ is branched and processed, and the resultant processed signal is multiplexed with the output of the final stage of amplifier $M_n$, and thus there is no such concern.

In addition, as an additional configuration, a configuration of injecting a compensation signal having the same amplitude as that of harmonics of the frequency component IM2 which are predicted to be generated by an amplifier device at an end thereof, a phase opposite to a phase of the harmonics to a circuit so as to compensate distortion. In this case, a new signal source that generates the compensation signal is necessary, and it is necessary to synchronize the compensation signal with a signal generated by the amplifier, and thus the configuration of the amplifier becomes complicate. In this embodiment, the signal source is not necessary, and a mechanism for synchronization is not necessary. Accordingly, this embodiment is realized with a simple configuration, and thus a reduction in size is easy.

Next, description will be given of an example of a circuit configuration for extraction of the frequency component IM2 from the multicarrier signal and for multiplexing of the component in the extraction circuit 9 of the multistage amplifier 1.

Figure 6:
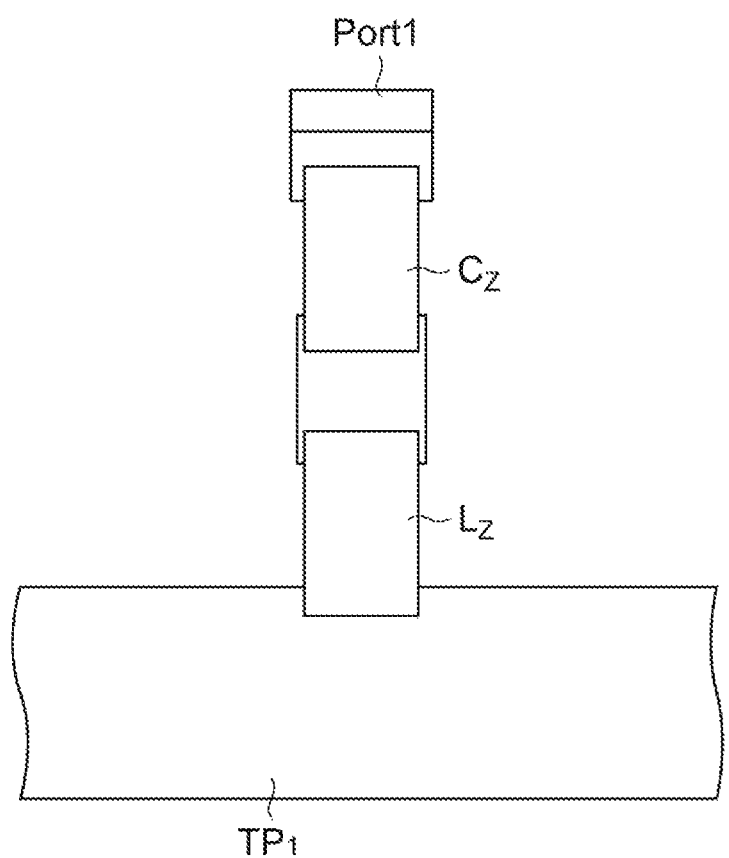
FIG. 6 is a view illustrating an example of a circuit configuration for extracting a signal in an extraction circuit 9.

FIG. 6 illustrates an example of a configuration for extraction of a signal in the extraction circuit 9. The extraction circuit 9 has a configuration in which a signal is extracted from a port Port1 through a serial circuit of an inductor $L_Z$ and a capacitor $C_Z$ which are connected in a manner of being branched from the middle of a transmission path $TP_1$ formed between the output of the $(n-1)^{th}$ stage of amplifier $M_{n-1}$ and an input of the final stage of amplifier $M_n$. The serial circuit is a bandpass filter that extracts the frequency component IM2 from the output signal of the $(n-1)^{th}$ stage of amplifier $M_{n-1}$, and is an example of the filter circuit 11. The serial circuit is configured to allow the frequency component IM2 to pass therethrough, but to cut off the fundamental wave components $f_1$ and $f_2$ so as not to affect transmission characteristics at the carrier frequencies $f_1$ and $f_2$ in the transmission path $TP_1$.

Figure 7:
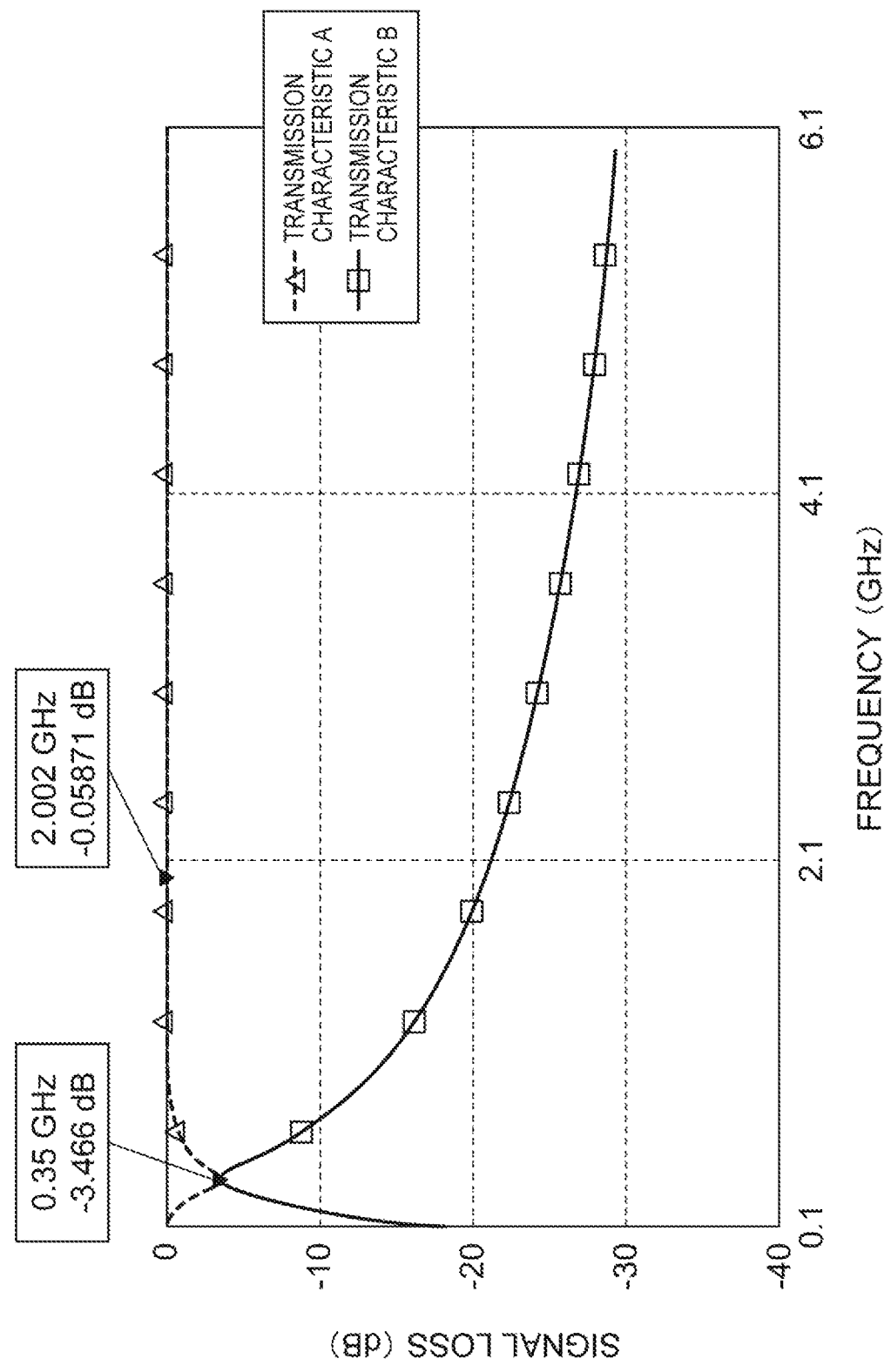
FIG. 7 is a graph showing a calculation example of signal transmission characteristics in the configuration illustrated in FIG. 6.

FIG. 7 shows a calculation example of signal transmission characteristics in the configuration illustrated in FIG. 6. A transmission characteristic A represents a characteristic from the output of the $(n-1)^{th}$ stage of amplifier $M_{n-1}$ to the input of the final stage of amplifier $M_n$, and a transmission characteristic B represents a characteristic from the output of the $(n-1)^{th}$ stage of amplifier $M_n$ to the port Port1. Here, for example, inductance of the inductor $L_Z$ is set to 39 nH, and capacitance of the capacitor $C_Z$ is set to 4.7 pF. In this manner, in the transmission characteristic A, a loss in a band including 2 GHz in the vicinity of the carrier frequency is approximately 0.1 dB and the loss is sufficiently reduced. In the transmission characteristic B, a loss of the frequency component IM2 at a frequency of 350 MHz is the smallest, and the loss is sufficiently large in the vicinity of a carrier frequency of 2 GHz.

Figure 8:
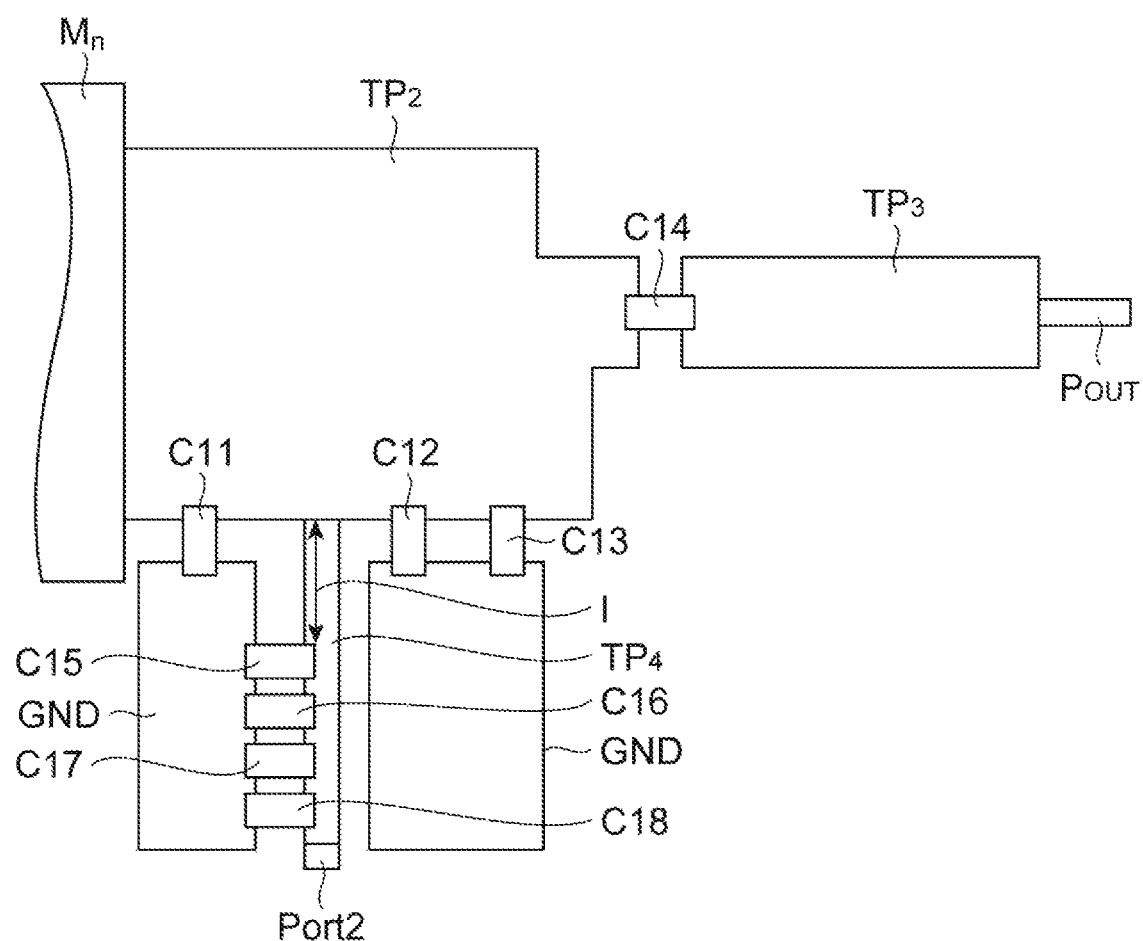
FIG. 8 is a view illustrating an example of a circuit configuration for signal multiplexing in the extraction circuit 9.

FIG. 8 illustrates an example of a configuration for multiplexing of the compensation signal of the frequency component IM2 in the extraction circuit 9. The extraction circuit 9 has a configuration in which the compensation signal of the frequency component IM2 is multiplexed with the output signal of the amplifier $M_n$ through a transmission path that is formed in a manner of being branched from the middle of the transmission path formed between the output of the final stage of amplifier $M_n$ and the output terminal $P_{OUT}$ to apply a bias voltage. That is, two transmission paths $TP_2$ and $TP_3$ are linearly formed between the output of the final stage of amplifier $M_n$ and the output terminal $P_{OUT}$, and the two transmission paths $TP_2$ and $TP_3$ are connected to each other by a capacitor C14 for DC cutoff. In addition, three capacitors C11, C12, and C13 for an output matching circuit are connected between the transmission path $TP_2$ and a ground pattern GND, a transmission path $TP_4$ is formed up to a port Port2 for bias voltage application in a manner of being branched from the middle of the transmission path $TP_2$, and bypass capacitors C15, C16, C17, and C18 are connected to between the transmission path $TP_4$ and the ground pattern GND. The port Port2 and the transmission path $TP_4$ are also commonly used as a circuit for multiplexing of the compensation signal of the frequency component IM2. In the circuit, the transmission path $TP_4$ has a transmission path length 1 ranging from a branching point from the transmission path $TP_2$ to the bypass capacitor C15. The transmission path length 1 and capacitance of the bypass capacitors C15, C16, C17, and C18 are set to satisfy the following requirements: (1) a transmission characteristic between the output of the amplifier $M_n$ and the port Port2 allows the frequency component IM2 to pass, (2) a transmission characteristic between the output of the amplifier $M_n$ and the port Port2 cut off the fundamental wave components $f_1$ and $f_2$, (3) a transmission characteristic of the transmission path $TP_2$ does not attenuate a frequency component of the carrier frequencies $f_1$ and $f_2$ as much as possible.

Figure 9:
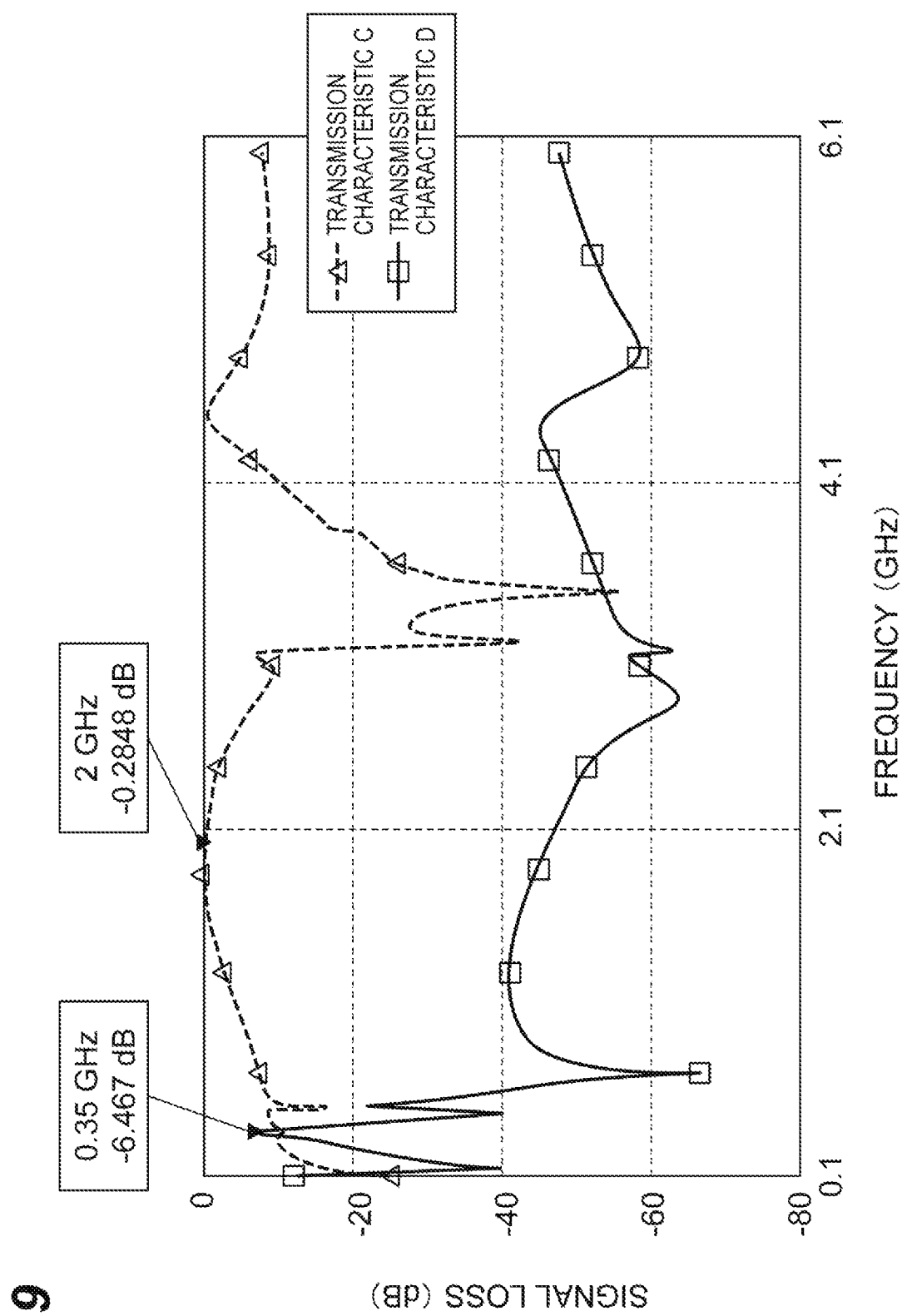
FIG. 9 is a graph showing a calculation example of signal transmission characteristics in the configuration illustrated in FIG. 8.

FIG. 9 shows a calculation example of signal transmission characteristics in the configuration illustrated in FIG. 8. A transmission characteristic C represents a characteristic from the output of the final stage of amplifier $M_n$ to the output terminal $P_{OUT}$, and a transmission characteristic D represents a characteristic from the output of the final stage of amplifier $M_n$ to the port Port2. In this manner, in the transmission characteristic C, a loss in a band including 2 GHz in the vicinity of the carrier frequency is approximately 0.3 dB and the loss is sufficiently reduced. In the transmission characteristic D, a loss of the frequency component IM2 at a frequency of 350 MHz is the smallest, and the loss is sufficiently large in the vicinity of a carrier frequency of 2 GHz. Accordingly, a component of the carrier frequency is not allowed to flow into the circuit for bias application.

Figure 10:
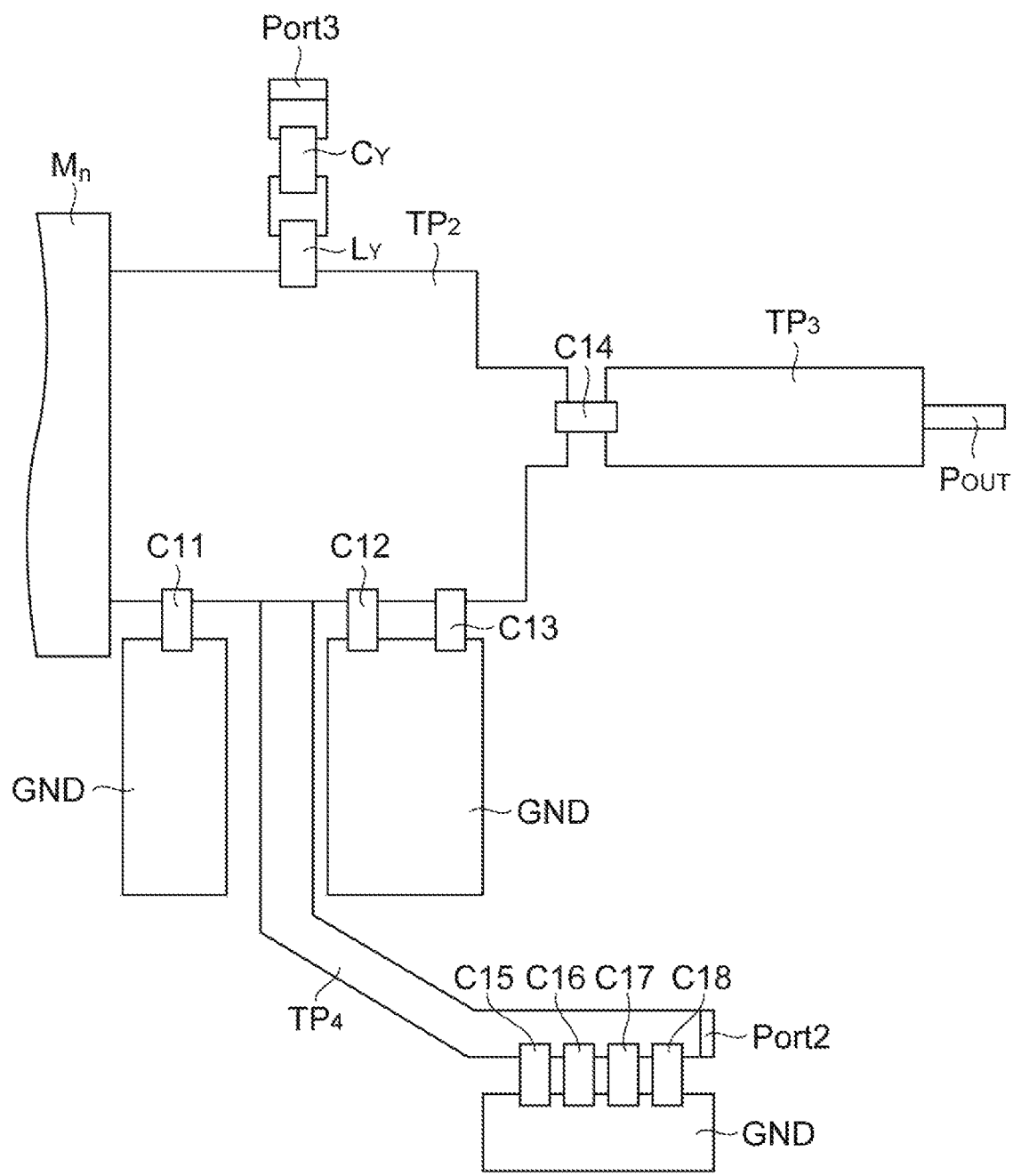
FIG. 10 is a view illustrating an example of a circuit configuration for signal multiplexing in the extraction circuit 9.

FIG. 10 illustrates another configuration example for multiplexing of the compensation signal of the frequency component IM2 with the output signal of the amplifier $M_n$ in the extraction circuit 9. In the configuration illustrated in FIG. 10, a circuit for signal multiplexing is provided separately from the circuit for bias application. That is, a serial circuit including an inductor $L_Y$ and a capacitor $C_Y$ is connected to between the middle of the transmission path $TP_2$ and a port Port3 for signal multiplexing in a manner of being branched. The serial circuit is a bandpass filter that allows the compensation signal of the frequency component IM2 to pass from the port Port3 to the transmission path $TP_2$. In the serial circuit, inductance of the inductor $L_Y$ and capacitance of the capacitor $C_Y$ are set to values with which the frequency component IM2 is allowed to pass, but the fundamental wave components $f_1$ and $f_2$ are cut off, and a frequency component of the carrier frequencies $f_1$ and $f_2$ in the transmission path $TP_2$ is not attenuated as much as possible.

Figure 11:
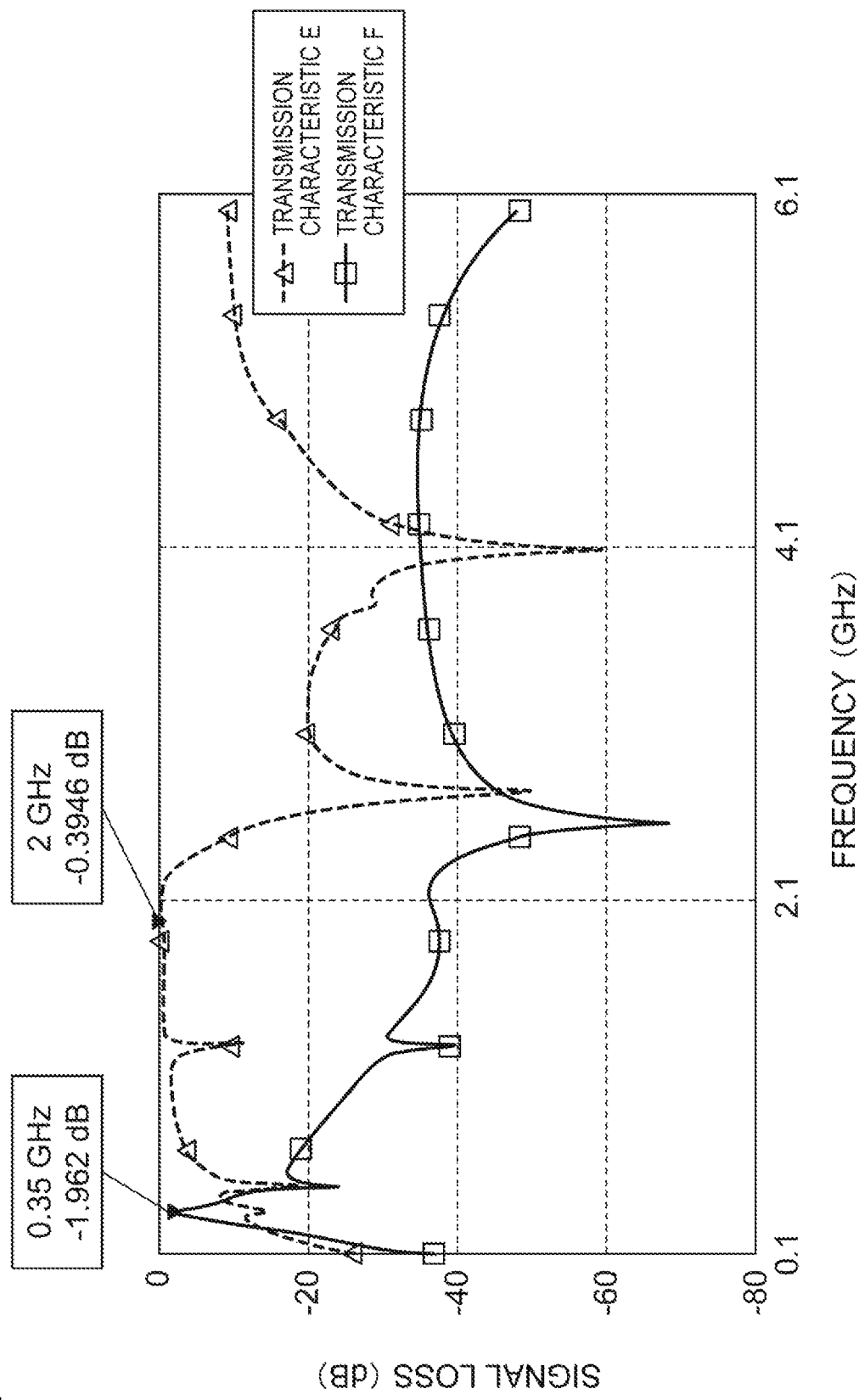
FIG. 11 is a graph showing a calculation example of signal transmission characteristics in the configuration illustrated in FIG. 10.

FIG. 11 shows a calculation example of signal transmission characteristics in the configuration illustrated in FIG. 10. A transmission characteristic E represents a characteristic from the output of the final stage of amplifier $M_n$ to the output terminal $P_{OUT}$, and a transmission characteristic F represents a characteristic from the output of the final stage of amplifier $M_n$ to the port Port3. Here, for example, the inductance of the inductor $L_Y$ is set to 15 nH, and the capacitance of the capacitor $C_Y$ is set to 12 pF. In this manner, in the transmission characteristic E, a loss in a band including 2 GHz in the vicinity of the carrier frequency is approximately 0.4 dB and the loss is sufficiently reduced. In the transmission characteristic F, a loss of the frequency component IM2 at a frequency of 350 MHz is the smallest, and a sufficiently large loss is applied in the vicinity of a carrier frequency of 2 GHz. Accordingly, a component of the carrier frequency is not allowed to flow into the circuit for signal multiplexing.

Hereinbefore, in a preferred embodiment, the principle of the present disclosure has been described with reference to the accompanying drawings. However, it should be understood by those skilled in the art that modifications can be made in arrangement and details without departing from the principle. The invention is not limited by the specific configuration of the present disclosure. Accordingly, all changes and modifications derived from the claims and the scope of the spirit thereof are claimed.

Figure 12:
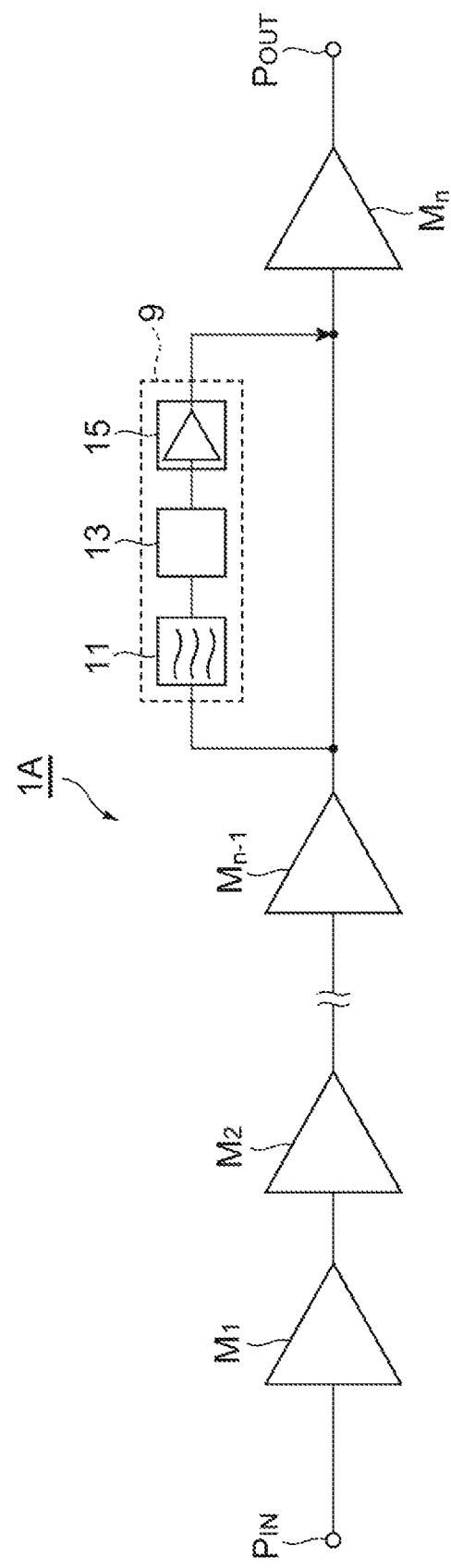
FIG. 12 is a block diagram illustrating a schematic configuration of a multistage amplifier 1A according to a modification example.

In the embodiment, the compensation signal of the frequency component IM2 is multiplexed with the output of the final stage of amplifier $M_n$. However, as in a multistage amplifier 1A according to a modification example illustrated in FIG. 12, the compensation signal of the frequency component IM2 may be multiplexed with an input of the final stage of amplifier $M_n$. Specifically, in the multistage amplifier 1A, an output of the extraction circuit 9 is connected to the input of the final stage of amplifier $M_n$, and an output signal (compensation signal) of the extraction circuit 9 is multiplexed with an input signal of the final stage of amplifier $M_n$. Note that, in FIG. 12, the output of the $(n-1)^{th}$ stage of amplifier $M_{n-1}$ is illustrated to be directly connected to the input of the final stage of amplifier $M_n$ in the drawing. However, actually, the output of the $(n-1)^{th}$ stage of amplifier $M_{n-1}$ is connected to the input of the final stage of amplifier $M_n$, for example, through a transmission path (transmission line), and thus the input signal of the amplifier $M_n$ is not the same as an output signal of the amplifier $M_{n-1}$, and may have delay (phase difference). Therefore, in FIG. 12, the direct line from the output of the $(n-1)^{th}$ stage of amplifier $M_{n-1}$ to the input of the final stage of amplifier $M_n$ actually includes such a transmission line or something like the transmission line. Accordingly, the configuration in FIG. 12 illustrates that the compensation signal of the frequency component IM2 generated from the output signal of the amplifier $M_{n-1}$ is multiplexed with a signal immediately before being input to the amplifier $M_n$. For example, in the extraction circuit 9, a phase of the compensation signal of the frequency component IM2 generated from the output signal of the amplifier $M_{n-1}$ is adjusted in accordance with propagation delay of the output signal of the amplifier $M_{n-1}$ up to the input of the amplifier $M_n$.

Figure 13:
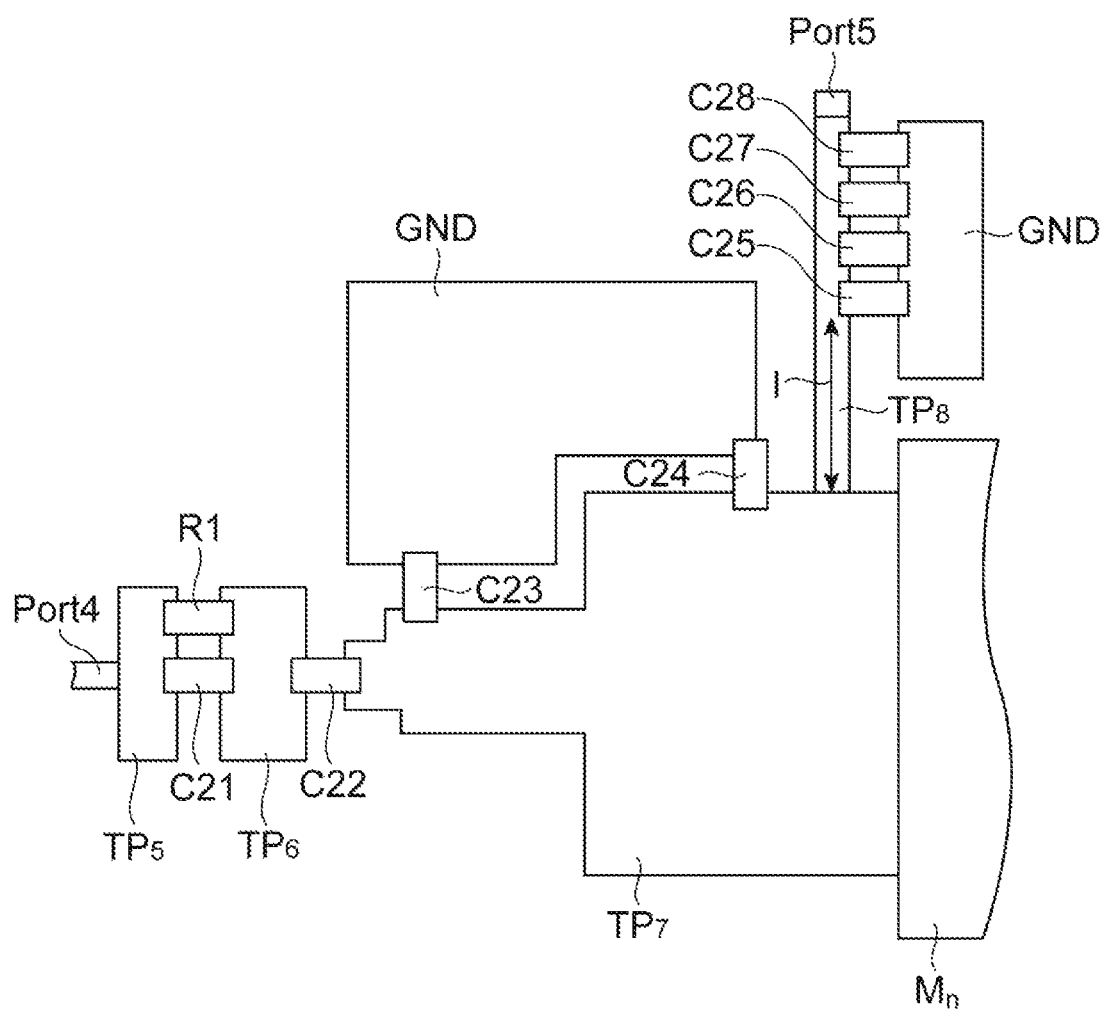
FIG. 13 is a view illustrating an example of a circuit configuration for signal multiplexing in the extraction circuit 9.

FIG. 13 illustrates an example of a configuration for multiplexing of the compensation signal of the frequency component IM2 in the extraction circuit 9 provided in the multistage amplifier 1A. The extraction circuit 9 has a configuration in which the compensation signal of the frequency component IM2 is multiplexed with a signal that is input to the amplifier $M_n$ through a transmission path for bias voltage application which is formed in a manner of being branched from the middle of a transmission path formed between the output of the $(n-1)^{th}$ stage of amplifier $M_{n-1}$ and the input of the final stage of amplifier $M_n$. That is, three transmission paths $TP_5$, $TP_6$, and $TP_7$ are linearly formed between a port Port4 connected to the output of the $(n-1)^{th}$ stage of amplifier $M_{n-1}$ and the input of the final stage of amplifier $M_n$, the transmission paths $TP_5$ and $TP_6$ are connected by a resistive element R1 and a capacitor C21 which constitute a high pass filter, and the transmission paths $TP_6$ and $TP_7$ are connected by a capacitor C22 for DC cutoff. In addition, two capacitors C23 and C24 for matching are connected to between the transmission path $TP_7$ and a ground pattern GND, a transmission path $TP_8$ is formed from the middle of the transmission path $TP_7$ to a port Port5 for bias voltage application in a manner of being branched, and bypass capacitors C25, C26, C27, and C28 are connected to between the transmission path $TP_5$ and the ground pattern GND. The port Port5 and the transmission path $TP_8$ are also commonly used as a circuit for multiplexing of the compensation signal of the frequency component IM2 with a signal that is input to the amplifier $M_n$. In the circuit, transmission characteristics of the input of the amplifier $M_n$ and the port Port5 are set to satisfy the following requirements by adjusting a transmission path length 1 ranging from a branching point of the transmission path $TP_7$ to the bypass capacitor C25 and capacitance values of the bypass capacitors C25, C26, C27, and C28: (1) the frequency component IM2 of the output signal of the amplifier $M_{n-1}$ is allowed to pass, (2) the fundamental wave components $f_1$ and $f_2$ of the output signal of the amplifier $M_{n-1}$ are cut off, (3) a frequency component of the carrier frequencies $f_1$ and $f_2$ in the transmission path $TP_7$ is not reduced as much as possible.

Figure 14:
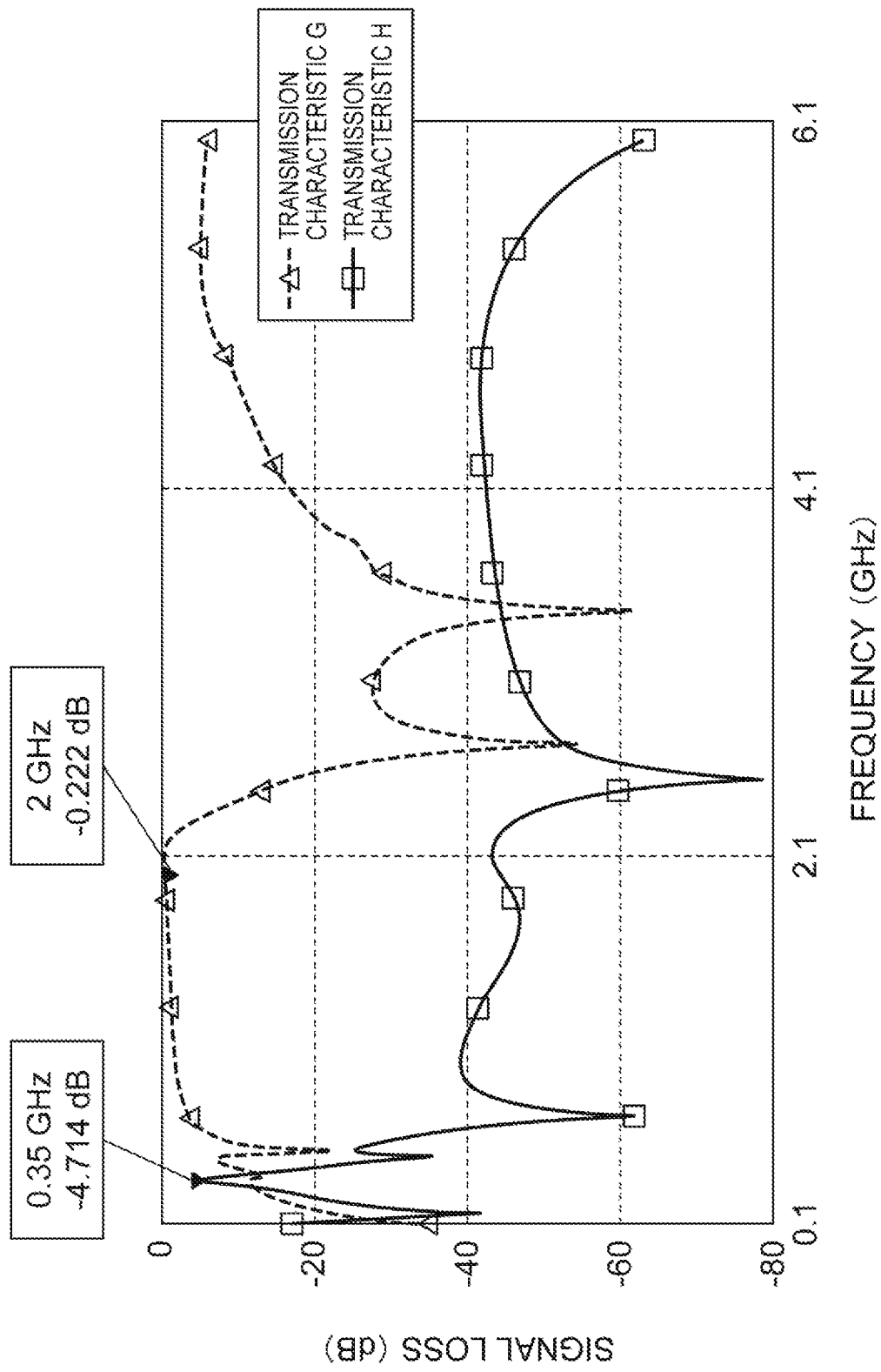
FIG. 14 is a graph showing a calculation example of signal transmission characteristics in the configuration illustrated in FIG. 13.

FIG. 14 shows a calculation example of the signal transmission characteristics in the configuration illustrated in FIG. 13. A transmission characteristic G represents a characteristic between the input of the final stage of amplifier $M_n$ and the port Port4, and a transmission characteristic H represents a characteristic between the input of the final stage of amplifier $M_n$ and the port Port5. In this manner, in the transmission characteristic G, a loss in a band including 2 GHz in the vicinity of the carrier frequency is approximately 0.2 dB and the loss is sufficiently reduced. In the transmission characteristic H, a loss of the frequency component IM2 at a frequency of 350 MHz is the smallest, and the loss is sufficiently large in the vicinity of a carrier frequency of 2 GHz. Accordingly, a component of the carrier frequency is not allowed to flow into the circuit for bias application.

Figure 15:
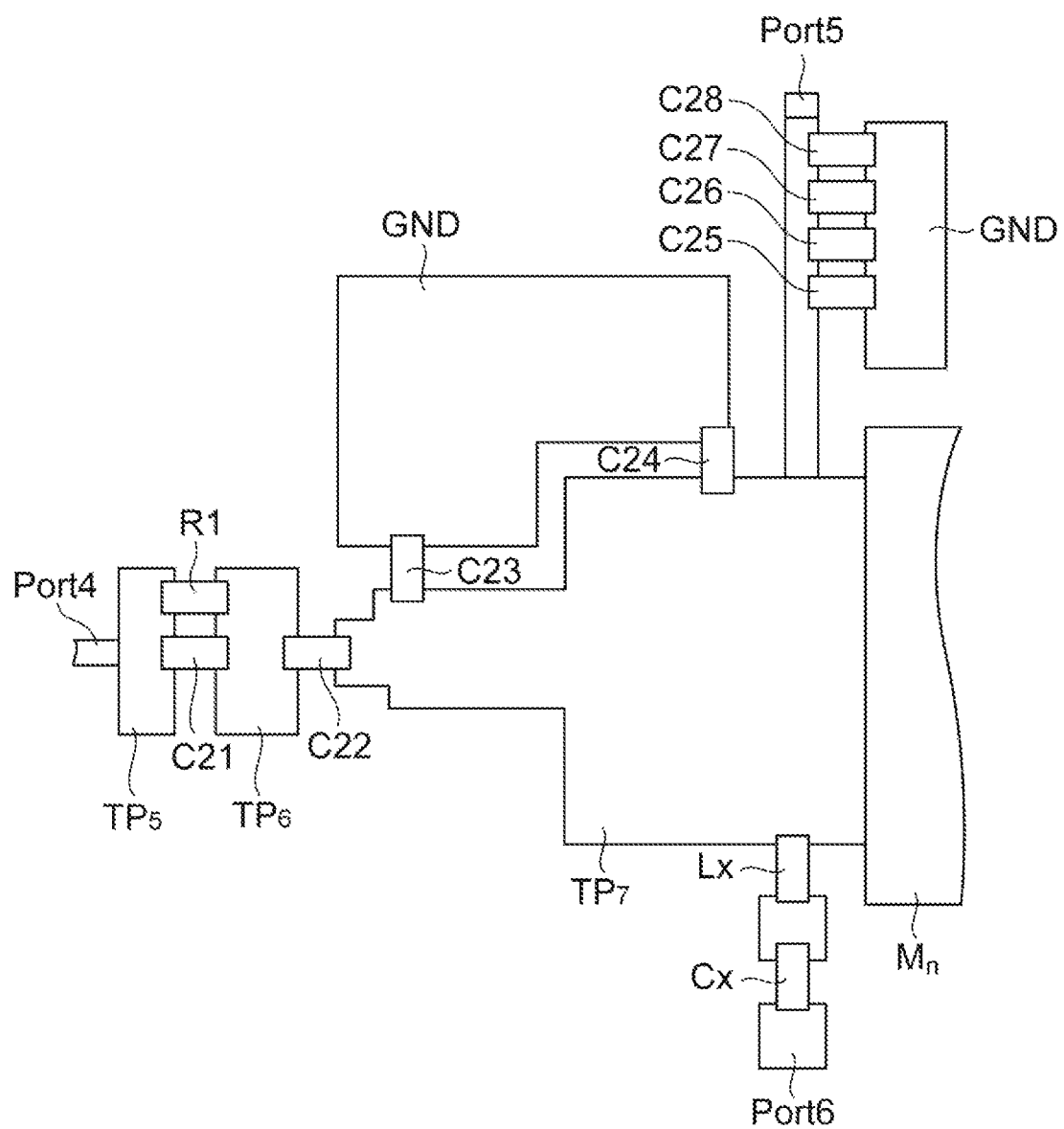
FIG. 15 is a view illustrating an example of a circuit configuration for signal multiplexing in the extraction circuit 9.

FIG. 15 illustrates another configuration for multiplexing of the compensation signal of the frequency component IM2 with the signal that is input to the amplifier $M_n$ in the extraction circuit 9 provided in the multistage amplifier 1A. In the configuration illustrated in FIG. 15, a circuit for signal multiplexing is provided separately from the circuit for bias application. That is, a serial circuit including an inductor $L_X$ and a capacitor $C_X$ is connected to between the middle of the transmission path $TP_7$ and a port Port6 for signal multiplexing in a manner of being branched. The serial circuit is a bandpass filter that allows a signal of the frequency component IM2 to pass from the port Port6 to the transmission path $TP_7$. The serial circuit is configured to allow the frequency component IM2 to pass therethrough, and to cut off the fundamental wave components $f_1$ and $f_2$ due to inductance of the inductor $L_X$ and capacitance of the capacitor $C_X$ so as not to affect transmission characteristics at the carrier frequencies $f_1$ and $f_2$ in the transmission path $TP_7$.

Figure 16:
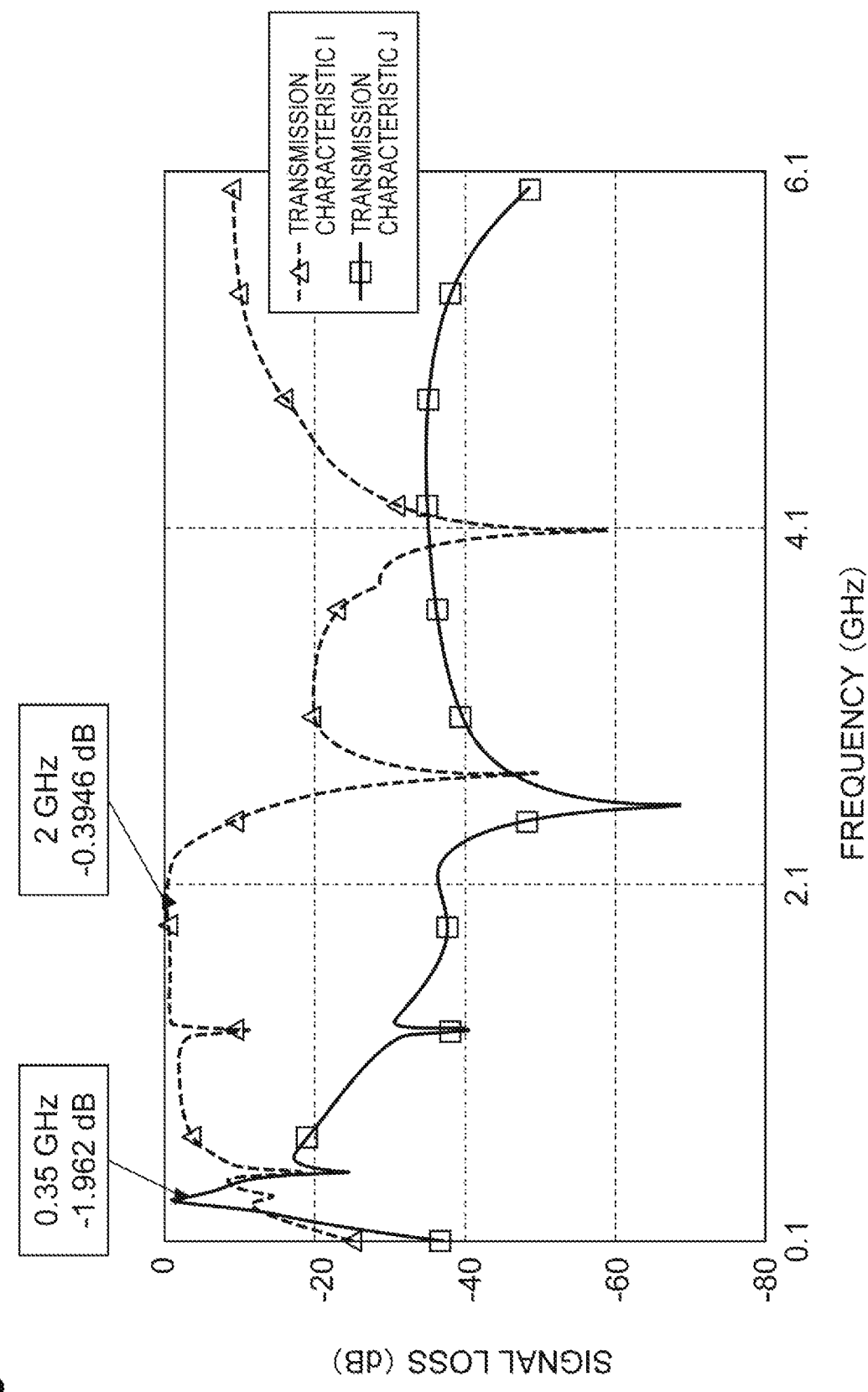
FIG. 16 is a graph showing a calculation example of signal transmission characteristics in the configuration illustrated in FIG. 15.

FIG. 16 shows a calculation example of the signal transmission characteristics in the configuration illustrated in FIG. 15. A transmission characteristic I represents a characteristic between the input of the final stage of amplifier $M_n$ and the port Port4, and a transmission characteristic J represents a characteristic between the input of the final stage of amplifier $M_n$ and the port Port6. Here, for example, the inductance of the inductor $L_X$ is set to 39 nH, and the capacitance of the capacitor $C_X$ is set to 4.7 pF. In this manner, in the transmission characteristic I, a loss in a band including 2 GHz in the vicinity of the carrier frequency is approximately 0.4 dB and the loss is sufficiently reduced. In the transmission characteristic J, a loss of the frequency component IM2 at a frequency of 350 MHz is the smallest, and the loss in the vicinity of a carrier frequency of 2 GHz is sufficiently large. Accordingly, a component of the carrier frequency is not allowed to flow into the circuit for signal multiplexing.

In the above-described multistage amplifiers 1 and 1A, the extraction circuit 9 may be disposed between an output of an $i^{th}$ stage of amplifier $M_i$ (i is a natural number satisfying a relationship of $1 \leq i \leq n-1$) and an input or an output of an $(i+1)^{th}$ stage of amplifier $M_{i+1}$ without limitation to the configuration in which the extraction circuit 9 is disposed between the output of the $(n-1)^{th}$ stage of amplifier $M_{n-1}$ and the input or the output of the final stage of amplifier $M_n$. Even in this configuration, at the output of the $(i+1)^{th}$ stage, it is possible to sufficiently reduce the second-order intermodulation distortion based on the two fundamental wave components or the cross modulation due to harmonics of the second-order intermodulation distortion. As a result, it is possible to improve quality of an output signal of the final stage.

In addition, the filter circuit 11 of the extraction circuit 9 extracts the frequency component IM2 of the differential frequency $(f_2-f_1)$ corresponding to a difference between the first carrier frequency $f_1$ and the second carrier frequency $f_2$ from the multicarrier signal, but the filter circuit 11 may extract a frequency component that is in times (an integer satisfying a relationship of $2 \leq m \leq 5$) the differential frequency $(f_2-f_1)$. Even in this case, it is possible to sufficiently reduce cross modulation due to harmonics of the second-order intermodulation distortion, and it is possible to improve quality in an output signal. In this configuration, a frequency component that is five times the differential frequency $(f_2-f_1)$ in the output signal of the final stage is reduced through phase adjustment in the phase shifter 13 and amplitude adjustment in the gain adjustment circuit 15. According to this, intermodulation distortion between a distortion component that is in times the frequency component IM2 that is injected by the extraction circuit 9 and a $(5-m)^{th}$-order harmonics of the frequency component IM2 is caused to occur, and thus it is possible to realize compensation of a fifth-order harmonics of the frequency component IM2. Accordingly, it is possible to reduce the above-described distortion components (A1) and (A3) which have an influence on signal quality, and it is possible to sufficiently improve the quality in an output signal.

Particularly, it is preferable that the filter circuit 11 of the extraction circuit 9 extracts a frequency component that is five times the differential frequency $(f_2-f_1)$ from the multicarrier signal, and a frequency component that is five times the differential frequency $(f_2-f_1)$ in an output signal of the final stage is reduced as much as possible through the phase adjustment in the phase shifter 13 and the amplitude adjustment in the gain adjustment circuit 15. In this case, it is possible to reduce the above-described distortion components (A1) and (A3) which have an influence on the signal quality, and thus it is possible to improve the quality in the output signal.

What is claimed is:

1. A multistage amplifier for amplifying a multicarrier signal including a first component having a first frequency f1 and a second component having a second frequency f2, the multistage amplifier generating an amplified multicarrier signal also including a distortion frequency component that is n times a differential frequency, f2−f1 (n is an integer equal to or greater than 1), and comprising:
   N amplifiers (N is an integer equal to or greater than 2), each amplifier being distinguished as an $i^{th}$ stage amplifier (i is an integer of 1 to N), a $(k+1)^{th}$ stage amplifier being cascaded to a $k^{th}$ stage amplifier ($1 \leq k \leq N-1$), and each amplifier being configured to amplify the multicarrier signal; and
   a compensation circuit minimizing the distortion frequency component and including an input and an output, the input being connected to an output of a $j^{th}$ stage amplifier (j is an integer of 1 to N−1), and the output providing a compensation signal to an input of a $(j+1)^{th}$ stage amplifier or an output of the $(j+1)^{th}$ stage amplifier, wherein the compensation circuit includes
   a filter circuit being connected to the output of the $j^{th}$ stage amplifier and being configured to extract the distortion frequency component,
   a phase shifter circuit being cascaded to the filter circuit, and being configured to shift a phase of an extracted distortion frequency component from the filter circuit, and
   an amplitude adjusting circuit being cascaded to the phase shifter circuit and being configured to adjust an amplitude of an extracted and phase-shifted distortion frequency component from the phase shifter circuit and generate the compensation signal.

2. The multistage amplifier according to claim 1, wherein the distortion frequency component is one times the differential frequency f2−f1.

3. The multistage amplifier according to claim 1, wherein the distortion frequency component is five times the differential frequency f2−f1.

4. The multistage amplifier according to claim 1, wherein the filter circuit includes a serial circuit including an inductor and a capacitor, the serial circuit being connected to each other in a manner of being branched from the middle of a transmission path between the output of the $j^{th}$ stage amplifier and the input of the $(j+1)^{th}$ stage amplifier.

5. The multistage amplifier according to claim 1, wherein the output of the compensation circuit is multiplexed with the output of the $(j+1)^{th}$ stage amplifier.

6. The multistage amplifier according to claim 5, wherein the output of the compensation circuit is connected to a transmission path, the transmission path being connected to the output of the $(j+1)^{th}$ stage amplifier in a manner of being branched, for bias application to the $(j+1)^{th}$ stage amplifier.

7. The multistage amplifier according to claim 5,
wherein the output of the compensation circuit is multiplexed with the output of the $(j+1)^{th}$ stage amplifier through a serial circuit including an inductor and a capacitor, the serial circuit being connected to the output of the $(j+1)^{th}$ stage amplifier in a manner of being branched.

8. The multistage amplifier according to claim 1,
wherein the output of the compensation circuit is multiplexed with the input of the $(j+1)^{th}$ stage amplifier.

9. The multistage amplifier according to claim 8,
wherein the output of the compensation circuit is connected to a transmission path, the transmission path being connected to a transmission path between the output of the $j^{th}$ stage amplifier and the $(j+1)^{th}$ stage amplifier in a manner of being branched, for bias application to the $j^{th}$ stage amplifier.

10. The multistage amplifier according to claim 8,
wherein the output of the compensation circuit is multiplexed with the input of the $(j+1)^{th}$ stage amplifier through a serial circuit including an inductor and a capacitor, the serial circuit being connected to a transmission path between the output of the $j^{th}$ stage amplifier and the $(j+1)^{th}$ stage amplifier in a manner of being branched.

11. The multistage amplifier according to claim 1,
wherein the $(j+1)^{th}$ stage amplifier is a $N^{th}$ stage amplifier, and the $j^{th}$ stage amplifier is a $(N-1)^{th}$ stage of amplifier.

* * * * *